(12) United States Patent
Lee

(10) Patent No.: US 9,129,849 B2
(45) Date of Patent: Sep. 8, 2015

(54) STACKED CAPACITOR STRUCTURE AND A FABRICATING METHOD FOR FABRICATING THE SAME

(71) Applicant: INOTERA MEMORIES, INC., Taoyuan County (TW)

(72) Inventor: Tzung-Han Lee, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 26 days.

(21) Appl. No.: 14/026,117

(22) Filed: Sep. 13, 2013

(65) Prior Publication Data

US 2014/0312460 A1  Oct. 23, 2014

(30) Foreign Application Priority Data

Apr. 22, 2013 (TW) .............................. 102114139 A

(51) Int. Cl.
*H01L 27/108* (2006.01)
*H01L 21/20* (2006.01)
*H01L 49/02* (2006.01)

(52) U.S. Cl.
CPC .... *H01L 27/10852* (2013.01); *H01L 27/10855* (2013.01); *H01L 28/91* (2013.01)

(58) Field of Classification Search
CPC .................. H01L 27/10855; H01L 27/10808
USPC ............................ 257/303–309; 438/256, 399
See application file for complete search history.

(56) References Cited

U.S. PATENT DOCUMENTS

| | | | | |
|---|---|---|---|---|
| 7,655,969 | B2* | 2/2010 | Takaishi | 257/303 |
| 2004/0004240 | A1* | 1/2004 | Nishikawa | 257/303 |
| 2008/0029801 | A1* | 2/2008 | Nakamura | 257/303 |
| 2010/0012996 | A1* | 1/2010 | Lin | 257/306 |
| 2011/0086490 | A1 | 4/2011 | Wang et al. | |
| 2011/0092044 | A1 | 4/2011 | Huang et al. | |
| 2011/0111573 | A1 | 5/2011 | Wang et al. | |

FOREIGN PATENT DOCUMENTS

| | | | |
|---|---|---|---|
| TW | 201113983 A | 4/2011 |
| TW | 201115688 A | 5/2011 |
| TW | 201117325 A | 5/2011 |

\* cited by examiner

*Primary Examiner* — Calvin Lee
(74) *Attorney, Agent, or Firm* — Rosenberg, Klein & Lee

(57) ABSTRACT

A stacked capacitor structure of the instant disclosure comprises a substrate and a plurality of stacked capacitors. The substrate has an insulating layer formed thereon and a plurality of contact plugs in the insulating layer, wherein the contact plugs are exposed on the upper surface of the insulating layer. Specially, each of the stacked capacitors comprises a lower electrode, a dielectric layer, and an upper electrode. The lower electrode is arranged on one of the contact plugs and has a columnar base portion and a crown shaped upper portion. The dielectric layer is arranged on the lower electrode and covers the outer surface of the lower electrode. The upper electrode is arranged above the lower electrode, wherein the dielectric layer is intermediately between the upper electrode and the lower electrode.

5 Claims, 10 Drawing Sheets

STACKED CAPACITOR STRUCTURE AND A FABRICATING METHOD FOR FABRICATING THE SAME

BACKGROUND OF THE INVENTION

1. Field of the Invention

The instant disclosure relates to a semiconductor capacitor and a fabricating method of semiconductor capacitor, in particular, to a stacked capacitor structure and a fabricating method for fabricating the same.

2. Description of Related Art

Dynamic random access memory (DRAM) is a common one of the products in the semiconductor memory device. DRAM is a storage device which is used to store charging data. Generally, each memory cell includes a capacitor and a transistor for controlling the transfer of stored electric charges. In DRAM, a plurality of word lines are in correspondence with the memory cells respectively along a column direction, and a plurality of bit lines are in correspondence with the memory cells respectively along a row direction. The memory cell is executing an addressing process by a word line and executing a storing process by a bit line. Further, the word line is utilized to control the transistor to couple or discouple the capacitor with the bit line, thereby to read in/out charging data of the memory cell.

However, DRAM manufacture is a highly competitive business. Therefore, reducing size of a single element to increase the density of the memory cells is very important. In other words, the most important thing is to increase the capacitance of each of the capacitors in a finite cell area.

SUMMARY OF THE INVENTION

According to an embodiment of the instant disclosure, a stacked capacitor structure is provided. Said stacked capacitor structure according to an embodiment of the instant disclosure comprises a substrate and a plurality of stacked capacitors. The substrate has an insulating layer formed thereon and a plurality of contact plugs in the insulating layer, wherein the contact plugs are exposed on the upper surface of the insulating layer. Each of the stacked capacitors comprises a lower electrode, an upper electrode, and a dielectric layer. The lower electrode is arranged on one of the contact plugs and includes a columnar base portion and a crown shaped upper portion having a trench formed thereon. The upper electrode is arranged above the lower electrode. The dielectric layer is arranged between the upper electrode and the lower electrode and covers the outer surface of the lower electrode.

A fabricating method of stacked capacitor structure according to an embodiment of the instant disclosure is further provided. The fabricating method can be used for fabricating a plurality of stacked capacitor structures on a substrate having an insulating layer formed thereon and a plurality of contact plugs in the insulating layer, wherein the contact plugs are exposed on the upper surface of the insulating layer. Said fabricating method comprises the following steps: The first step is forming an electrode material columnar body on each of the contact plugs. The next step is forming a first sacrificial layer on the insulating layer and the first sacrificial layer covers the electrode material columnar bodies. The next step is forming a plurality of openings in the first sacrificial layer in correspondence with the electrode material columnar bodies. The next step is forming an electrode material layer in the openings to cover the inner surface of each of the openings and to cover each of the electrode material columnar bodies. The next step is removing the first sacrificial layer to form a plurality of lower electrodes and at least one gap, wherein each of the lower electrodes comprises a columnar base portion and a crown shaped upper portion, each gap is arranged between two immediately adjacent lower electrodes, and the crown shaped upper portion has a trench formed thereon. The next step is forming a dielectric layer on the lower electrodes and the dielectric layer covers the inner surface of each of the trenches and the outer surface of each of the lower electrodes. The last step is forming an upper electrode on the dielectric layer.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
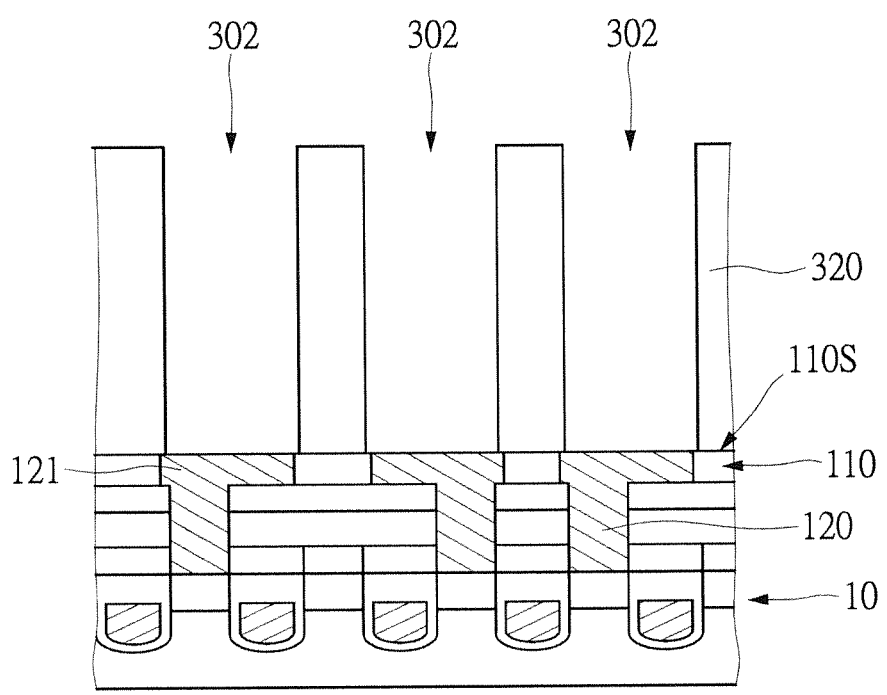
FIGS. 1 to 9 show partial cross-sectional views of a stacked capacitor structure in fabricating process according a preferred embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Please refer to FIGS. 1 to 9, which show partial cross-sectional views of a stacked capacitor structure in fabricating process according a preferred embodiment of the instant disclosure. The stacked capacitor structure 1 comprises a substrate 10 and a plurality of stacked capacitor 20, which includes at least one lower electrode 210, at least one upper electrode 220 and a dielectric layer 230. A fabricating method of stacked capacitor structure of the instant disclosure comprises the following steps. First, the substrate 10 having an insulating layer 110 formed thereon is provided. In this embodiment, the substrate 10 is an n-doped silicon substrate or a p-doped substrate for fabricating semiconductor structures such as active area, insulating structure, insulating layer 110, etc., on an upper surface thereof. Concretely speaking, said insulating structure is shallow trench isolation (STI) for isolating said active areas. Said insulating layer 110 is a silicon oxide layer. Further, said substrate 10 may include a memory array region and a peripheral circuit region. In order to simplify the description, only the memory array region herein will be described.

Figure 2:
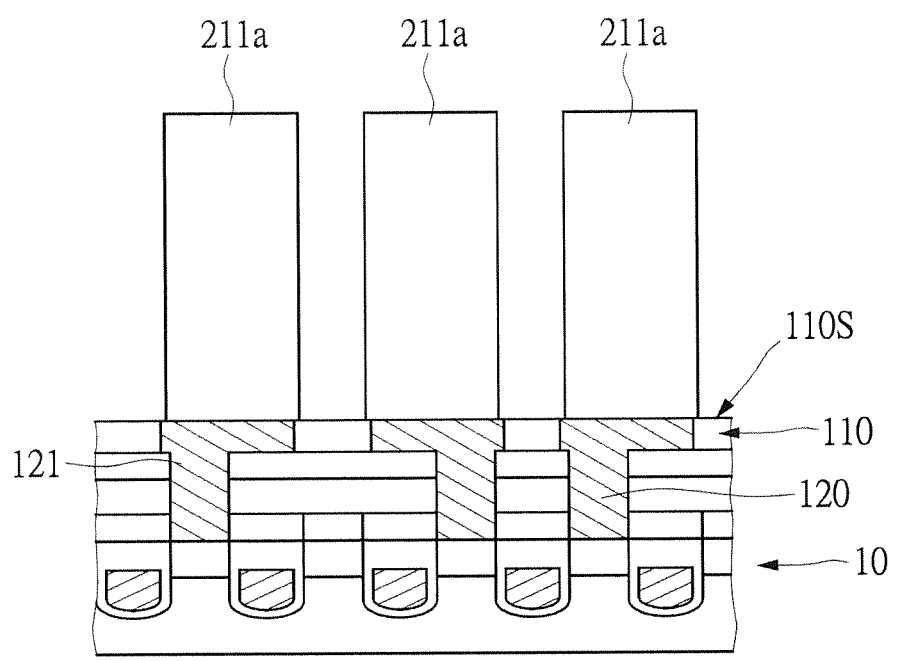

Referring to FIGS. 1 and 2, the insulating layer 110 has a plurality of contact plugs 120 formed therein at intervals substantially equal to a predetermined width. For example, the method of forming the contact plugs 120 comprises the following sub-steps. The first sub-step is forming a plurality of plug openings in the insulating layer 110 at intervals substantially equal to a predetermined width. The second sub-step is filling a conducting material into each of the plug openings, wherein the contact plugs 120 are exposed on an upper surface 110s of the insulating layer 110. In this embodiment, each of the contact plugs 120 may be utilized as a storage node contact (SNC). Said conducting material is tungsten (W), titanium nitride (TiN) or polysilicon.

Second, an electrode material columnar body 211a is formed on each of the contact plugs 120. Concretely speaking, the method of forming the electrode material columnar bodies 211a comprises the following sub-steps. The first sub-step is forming a second sacrificial layer 320 on the insulating layer 110. The second sacrificial layer 320 is a silicon oxide layer such as TEOS formed by PECVD or HDP-CVD. In various embodiments, the second sacrificial layer 320 are materials selected form the group consisting of a high temperature oxide layer, a USG layer, a BPSG layer, a double layered structure composed of the oxide layer and the USG layer, or a double layered structure composed of the oxide layer and the BPSG layer. Further, the thickness of the second sacrificial layer 320 can be adjusted according to the design of the semiconductor structures such as the height of the electrode material columnar bodies 211a. For example, the thickness of the second sacrificial layer 320 must be equal to or greater than the level of the electrode material columnar bodies 211a.

The next sub-step is forming a plurality of contact openings 302 in the second sacrificial layer 320 at intervals in correspondence with the contact plugs 120. The process of forming the contact openings 302 includes forming a mask on the second sacrificial layer 320 first, and then etching the uncovered second sacrificial layer 320 to form the contact openings 302. In this embodiment, the mask is a patterned photoresistance layer made of positive photoresist or negative photoresist. As shown in FIG. 1 in the instant disclosure, each contact openings 302 formed in the second sacrificial layer 320 extends to the corresponding contact plug 120, and the top of the contact plugs 120 can be exposed.

The next sub-step is filling an electrode material into the contact openings 302. The electrode material filled in each contact opening 302 is in contact to the contact plug 120. The electrode material can be polysilicon, tungsten (W), titanium nitride (TiN), or other electrically conducting material. The last sub-step is removing the second sacrificial layer 320 to form a plurality of electrode material columnar bodies 211a on each of the contact plugs 120. The electrode material columnar bodies 211a are respectively in contact to and electrically connected to the contact plugs 120. Concretely speaking, the second sacrificial layer 320 is removed by a wet etching process using etching solution having high selection ratio to select the second sacrificial layer 320 according to the electrode materials. In this embodiment, said etching solution is mixed solution of hydrogen peroxide ($H_2O_2$), water, and hydrofluoric acid (HF), and said second sacrificial layer 320 may also be removed by a plasma etching process.

In various embodiments, the step of forming the electrode material columnar bodies 211a may further comprise a sub-step of forming an etching stop layer on the substrate 10 before the sub-step of forming the second sacrificial layer 320 to prevent the insulating layer 110 from cracking during the etching process. Said etching stop layer can be used as a part of the lower electrode 210 and made of polysilicon or TiN. The etching stop layer can be formed by LPCVD. Specially, the etching stop layer can be formed while or after the forming the contact plugs 120 in the substrate 10.

Figure 3:
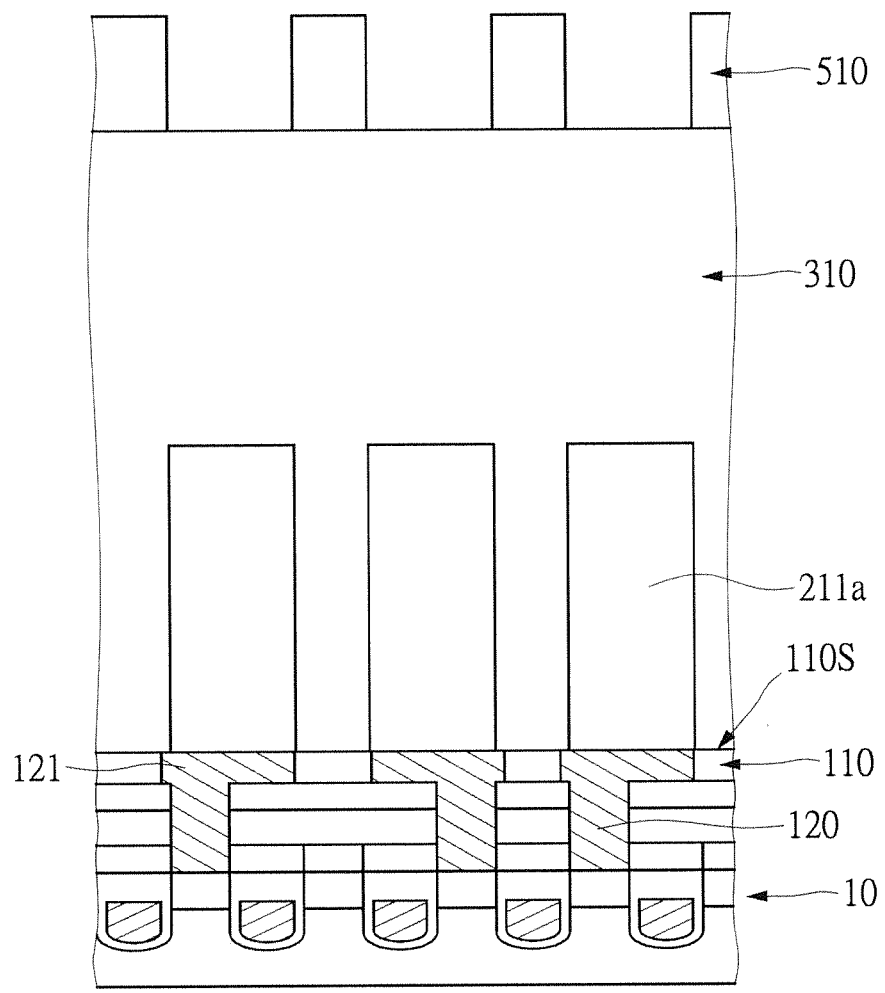

Referring to FIG. 3, subsequently, a first sacrificial layer 310 is formed on the insulating layer 110 and the first sacrificial layer 310 covers the electrode material columnar bodies 211a. The first sacrificial layer 310 can be a oxide layer such as a TEOS layer formed by PECVD or HDP-CVD. In various embodiments, the first sacrificial layer 310 is formed from the deposition of a high temperature oxide layer, a USG layer, a BPSG layer. In other words, the first sacrificial layer 310 is made of two sub-layers where the deposition sequence is not limited. For example, the thickness of the first sacrificial layer 310 must be greater than the height of the electrode material columnar bodies 211a. Further, the thickness of the first sacrificial layer 310 can be adjusted according to the design of the semiconductor structures such as crown shaped portions 212 of lower electrodes 210 formed by the subsequent steps of the instant disclosure. To put it concretely, the electrode material columnar bodies 211a can be embedded in the first sacrificial layer 310 as shown in FIG. 3.

Figure 4:
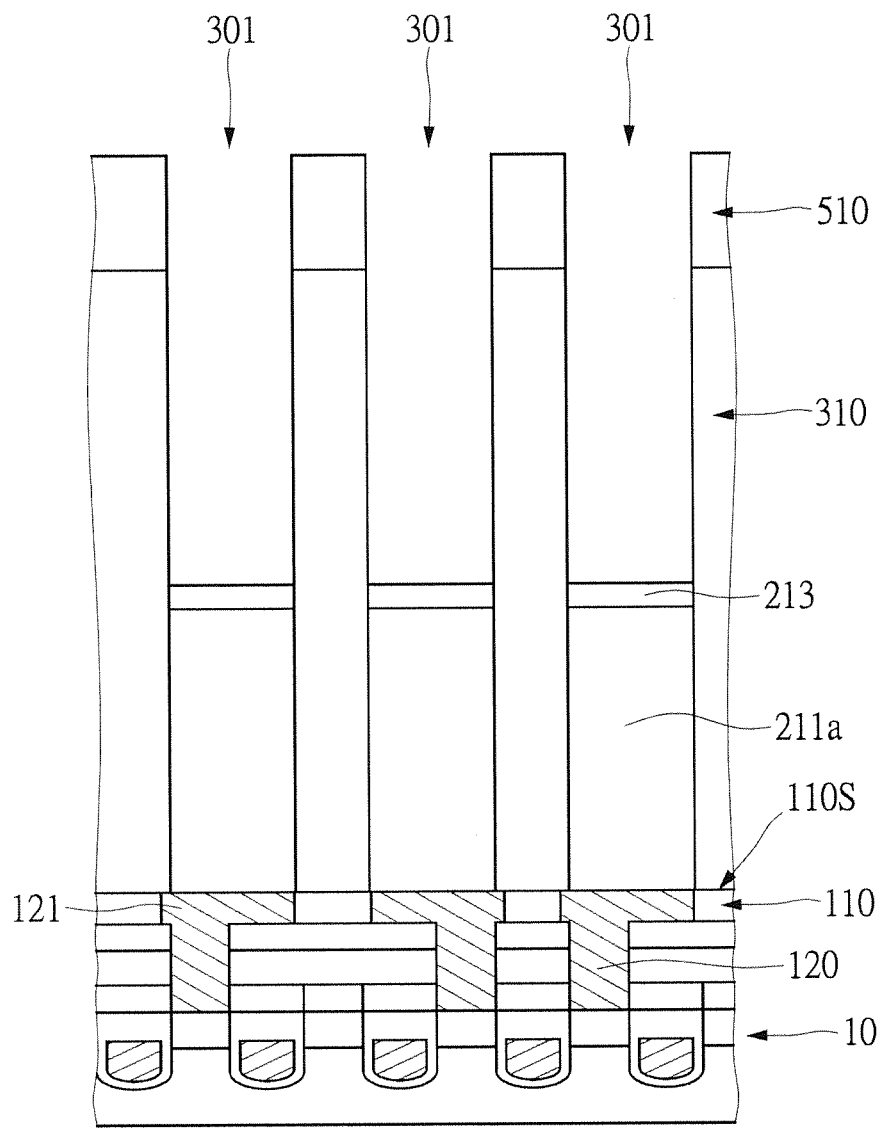

Referring to FIG. 4, next, a plurality of openings 310 is formed in the first sacrificial layer 310 at intervals in correspondence with the electrode material columnar bodies 211a. Concretely speaking, the step of forming the openings 310 comprises the following sub-steps. The first sub-step is forming a patterned silicon nitride layer 510 on the first sacrificial layer 310, wherein the patterned silicon nitride layer 510 is used as a mask. The second sub-step is etching the uncovered first sacrificial layer 310 to form the openings 301. As shown in FIG. 4 in the instant disclosure, each opening 310 formed in the first sacrificial layer 310 extends to the corresponding electrode material columnar body 211a, and the top of the electrode material columnar bodies 211a can be exposed.

Figure 5:
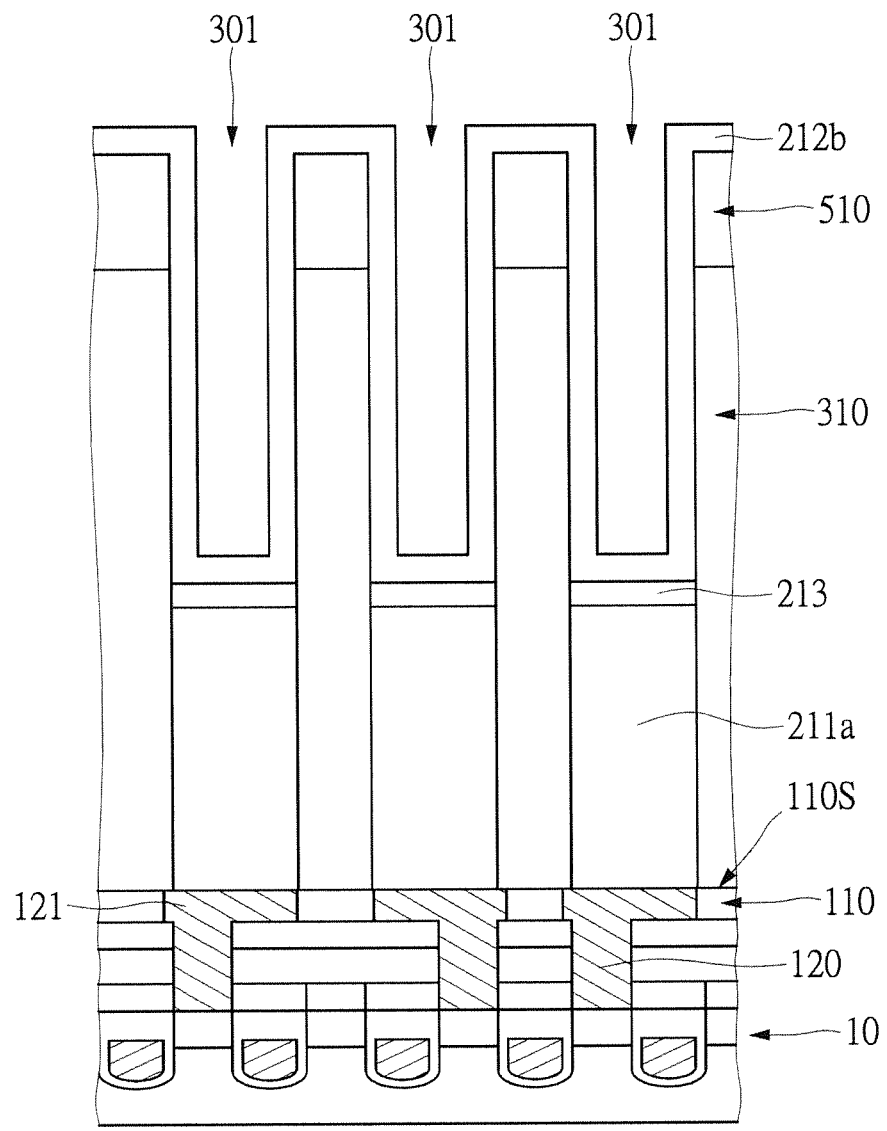
Figure 6:
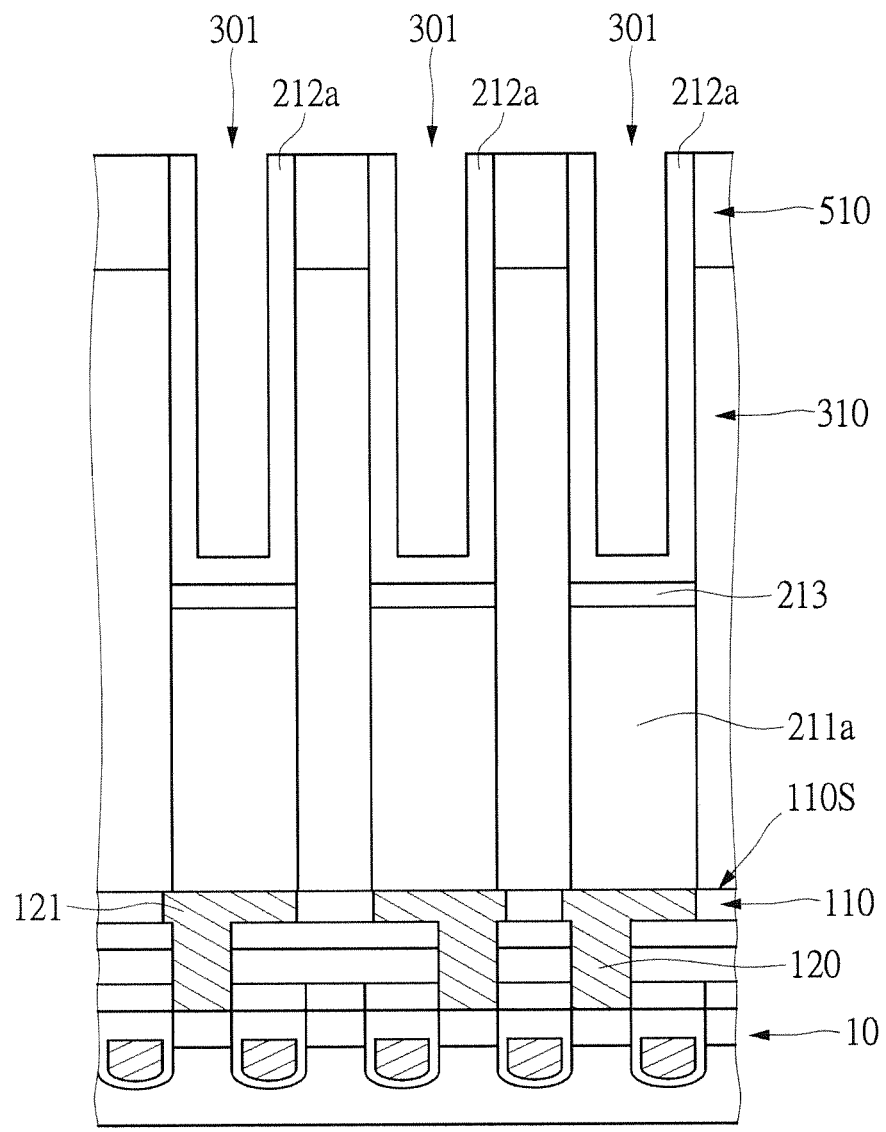

Referring to FIGS. 5 and 6, next, an electrode material layer 212a is formed in each opening to cover the inner surface of each of the openings 301 and to cover each of the electrode material columnar bodies 211a. The electrode material layer 212a can be in contact to and electrically connected to the electrode material columnar body 212a. Concretely speaking, the step of fitting the lower electrode layer 212a comprises the following sub-steps. The first sub-step is depositing a electrode material initial layer 212b on the first sacrificial layer 310, wherein the electrode material initial layer 212b covers the inner surface of the openings 301 and the electrode material columnar bodies 211a. Specifically, the electrode material initial layer 212b can conformingly covers the first sacrificial layer 310, the patterned silicon nitride layer 510, the openings 301, and the top of the electrode material columnar bodies 211a. The electrode material initial layer 212b can be in contact to the top of the electrode material columnar bodies 211a. The electrode material initial layer 212b is made of polysilicon, tungsten (W), titanium nitride (TiN) or other suitable electrically conducting materials. The second sub-step is removing a part of the electrode material initial layer 212b positioned above the first sacrificial layer 310 through a CMP or an etch-back process. Hence, the electrode material initial layer 212b positioned in the openings 301 can be disconnected. For example, said etch-back process can use etching solution having high selection ratio to select the lower electrode initial layer 212b according to the first sacrificial layer 310 for forming an electrode material layer 212a in each of the openings 301.

Specially, the fabricating method of stacked capacitor structure can comprises a step of depositing metal materials into the openings 301 and on the electrode material columnar bodies 211a before the step of forming the electrode material layers 212a. As shown in FIG. 4 specifically, the metal materials can be deposited on the exposed top end of the electrode material columnar bodies 211a. In this embodiment, said electrode material columnar bodies 211a are made of polysilicon, and said electrode material layers 212a are made of TiN. Moreover, the fabricating method of stacked capacitor structure can further comprises a step of depositing titanium materials into each of the openings 301 before the step of forming the electrode material layers 212a to form a middle portion 213 on each of the electrode material columnar bodies 211a, wherein said middle portion 213 is a metal silicide. Note that in the instant disclosure, the electrode material initial layer 212b is in contact to the middle portion 213.

Figure 7:
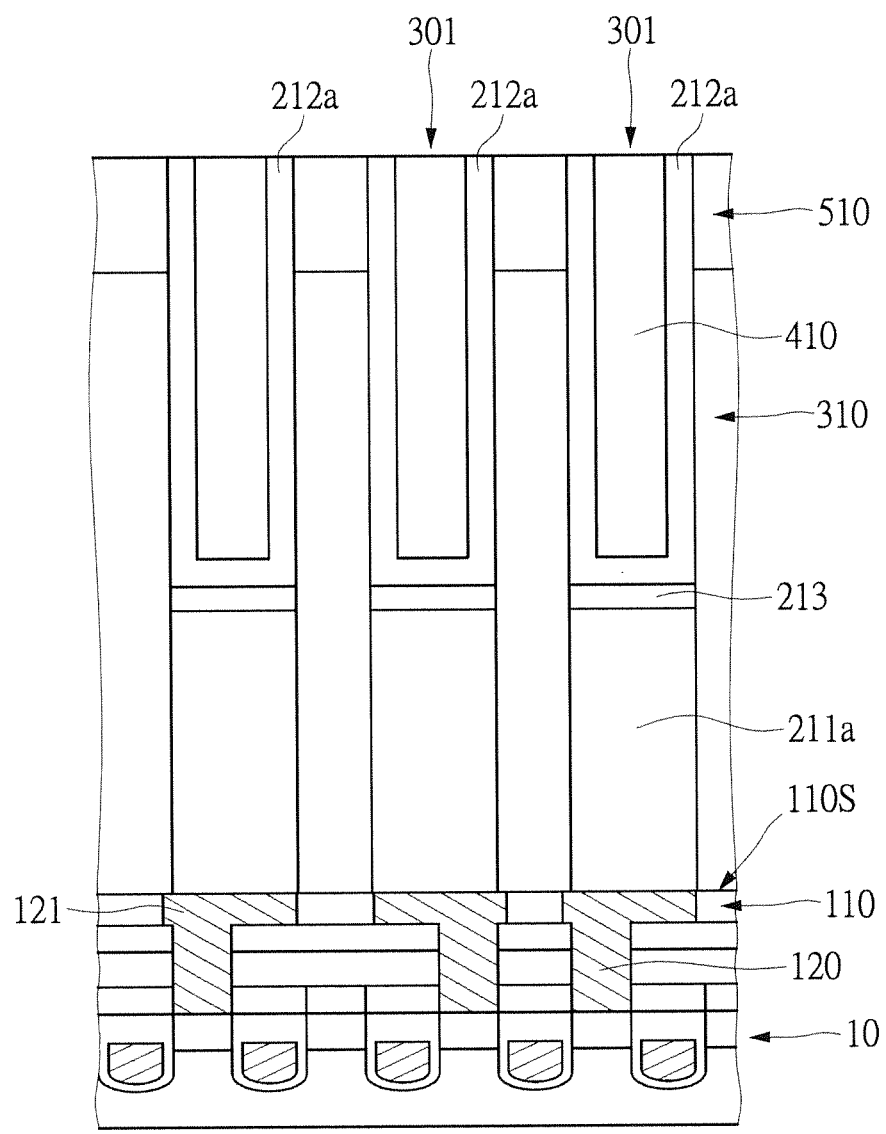
Figure 8:
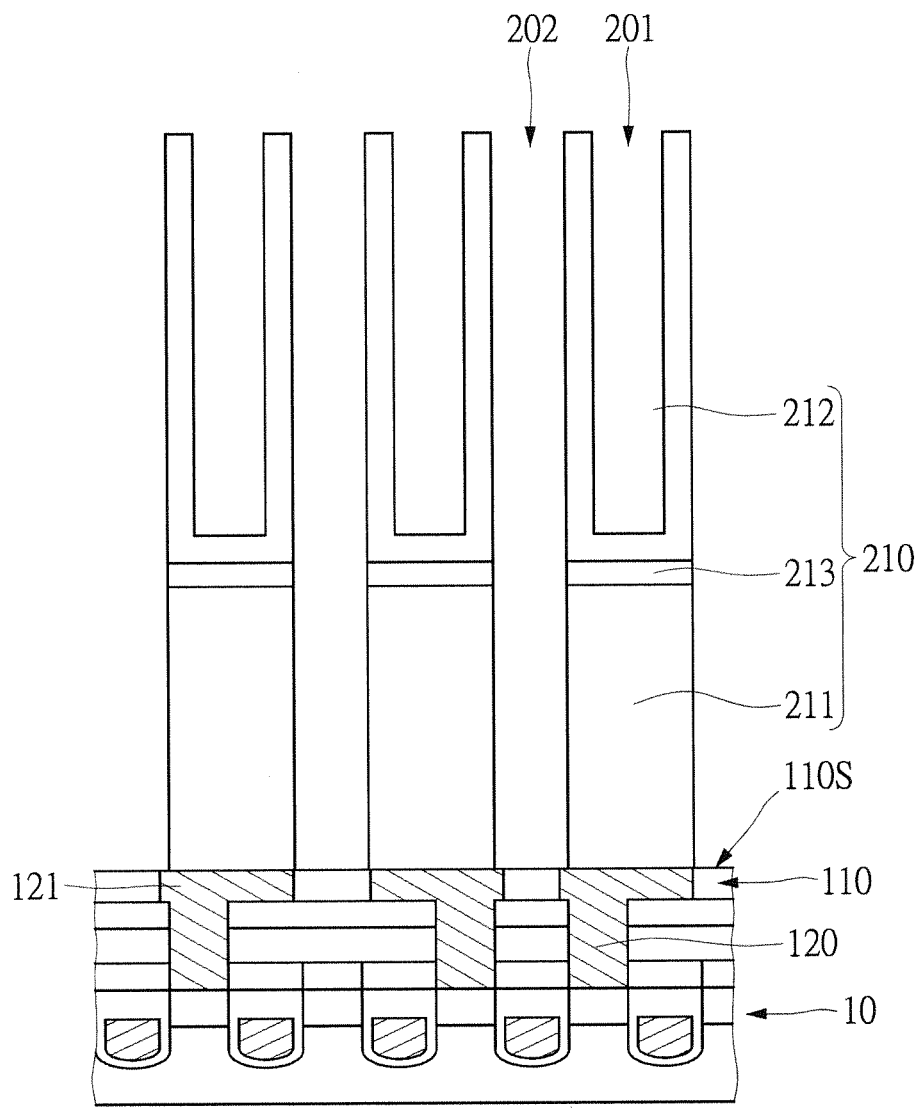

Referring to FIGS. 7 and 8, the first sacrificial layer 310 is then removed to form a plurality of lower electrodes 210. Each of the lower electrodes 210 comprises a columnar base portion 211, a crown shaped portion 212, and a middle portion 213. A gap 202 is formed between two immediately adjacent lower electrodes 210. The crown shaped portion 212 has a trench 201 formed thereon, and the middle portions 213 is between the columnar base portion 211 and the crown shaped portion 212 for connecting the columnar base portion 211 and the crown shaped portion 212. Moreover, as shown in FIG. 7, the fabricating method of stacked capacitor structure can further comprise the following sub-steps before the step of removing the first sacrificial layer 310. The first sub-step is filling a protecting material 410 into the openings 301. Said protecting material 410 can be easily removal material selected form the group consisting of photoresist (positive photoresist or negative photoresist), anti-reflecting layer (ARC), etc. Thereby, the protecting material 410 can provide a suitable supporting force to the crown shaped portion 212 of the lower electrode 210. In other hand, the protecting material 410 can also prevent the etching medium such as plasma from inserting the trench 201 of the crown shaped portion 212.

In this embodiment, the first sacrificial layer 310 is removed by an etching process using etching solution having high selection ratio to select the first sacrificial layer 310 according to the lower electrodes 210. Thereby, the first sacrificial layer 310 positioned between two adjacent lower electrodes 210 can be easily removed. Note that in a instant disclosure, the patterned silicon nitride layer 510 positioned above the first sacrificial layer 310 can also be removed during the CMP process. The second sub-step is removing the protecting material 410 through an etching process according to the property of the protecting material 410 such as photoresist or ARC. Note that on one exemplary embodiment, the height of the columnar base portion 211 may range from ½ to ¾ of the height of the crown shaped upper portion 213. In another exemplary embodiment, the height of the columnar base portion 211 may range from ⅓ to ½ of the height of the crown shaped upper portion 213.

Figure 9:
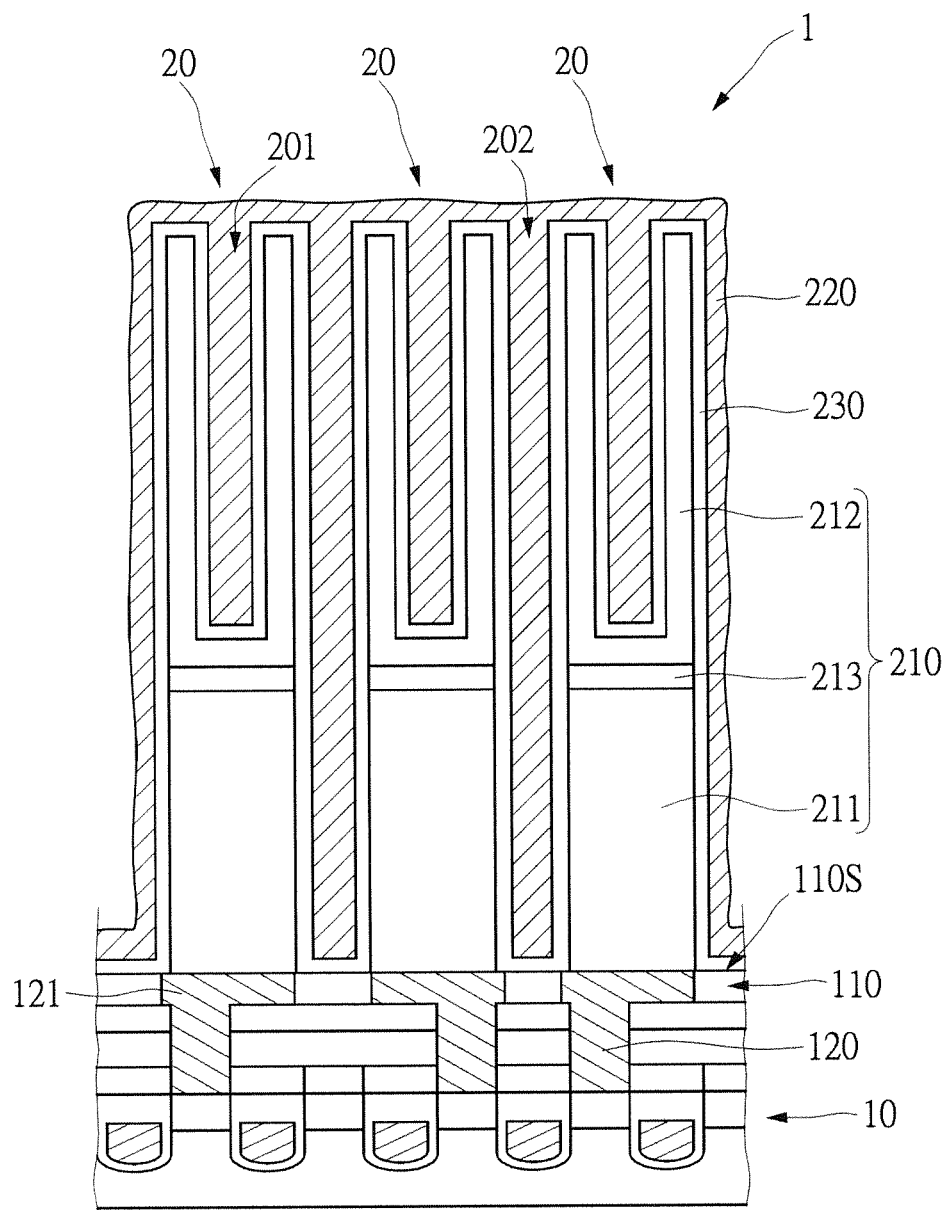

Referring to FIG. 9, subsequently, a dielectric layer 230 is formed on the lower electrodes 210, wherein the dielectric layer 230 covers the inner surface of each of the trenches 310 and the outer surface of each of the lower electrodes 210. Specifically, the dielectric layer 230 may conformingly cover the insulating layer 110, the inner surface of the gaps 202, the inner surface of the openings 301, and the top of the electrode material columnar bodies. In another exemplary embodiment, the thickness of the dielectric layer 230 can range from ⅓ to ½ of the height of the columnar base portion 211. That is, the dielectric layer 230 positioned on the insulating layer 110 has a thickness, which ranges from ⅓ to ½ of the height of the columnar base portion 211. Finally, an upper electrode 220 is formed on the dielectric layer 230 to form a plurality of stacked capacitors 20 arranged on the contact plugs 120. The lower electrodes 210 and the upper electrode 220 can be electrically insulated from each other by the dielectric layer 230, and each stacked capacitors 20 is electrically connects to each of the contact plugs 120. Said upper electrode 220 is made of polysilicon, tungsten (W), titanium nitride (TiN) or other suitable electrically conducting materials.

Figure 10:
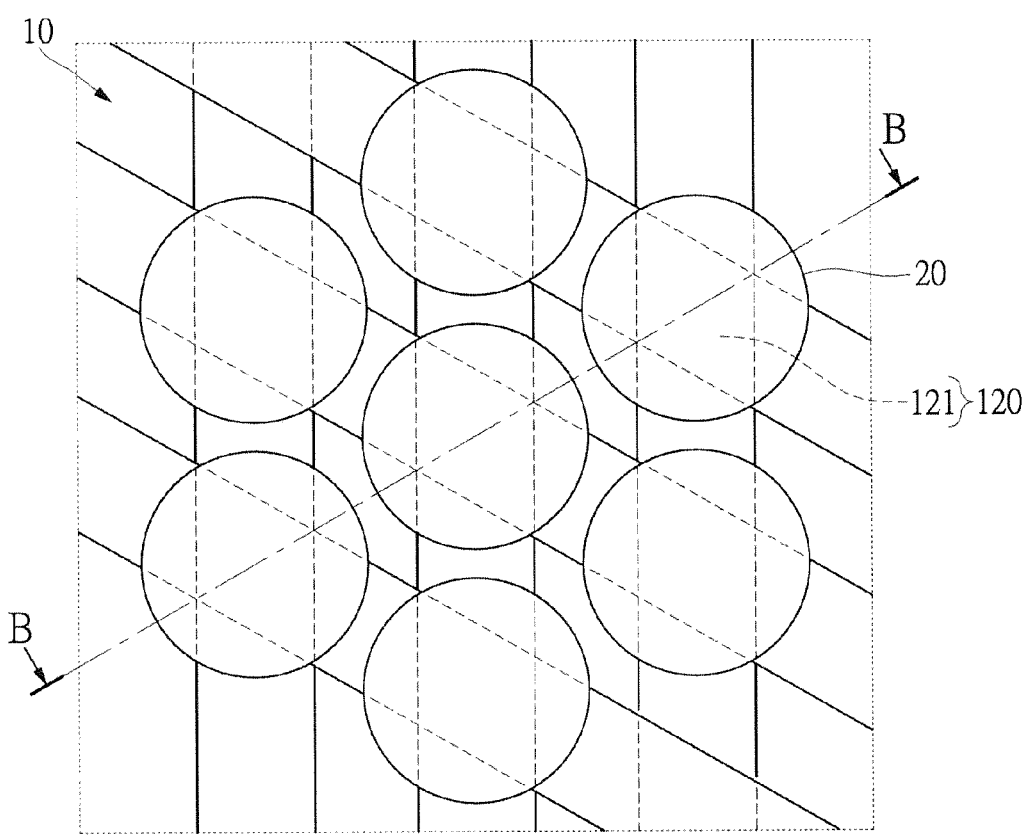
FIG. 10 shows a top view of a stacked capacitor structure according to an embodiment of the instant disclosure.

Specially, each of the contact plugs 120 arranged in the substrate 10 has a contact pad (not shown) positioned on the top of the contact plugs 120 and exposed on the upper surface 110s of the insulating layer 110. Referring to FIG. 10, which shows a top view of a stacked capacitor structure according to an embodiment of the instant disclosure. FIGS. 1 to 9 can present partial cross-sectional views of a stacked capacitor structure in fabricating process according a preferred embodiment of the instant disclosure along line B-B in FIG. 10. The contact plugs 120 and the stacked capacitors 20 formed thereon can be arranged in hexagonal.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A stacked capacitor structure comprising:
a substrate having an insulating layer formed thereon and a plurality of contact plugs in the insulating layer, wherein the contact plugs are exposed on the upper surface of the insulating layer; and
a plurality of stacked capacitors, each of which comprising:
a lower electrode arranged on one of the contact plugs, wherein the lower electrode has a columnar base portion and a crown shaped upper portion and a middle portion arranged between the columnar base portion and a crown shaped upper portion;
an upper electrode arranged above the lower electrode;
a dielectric layer arranged between the upper electrode and the lower electrode, wherein the dielectric layer covers the outer surface of the lower electrode, the dielectric layer having a height ranging from ⅓ to ½ of a height of the columnar base portion.

2. The capacitor structure according to claim 1, wherein the middle portion is a metal silicide layer.

3. The capacitor structure according to claim 1, wherein the height of the columnar base portion ranges from ½ to ¾ of the height of the crown shaped upper portion.

4. The capacitor structure according to claim 1, wherein the height of the columnar base portion ranges from ⅓ to ½ of the height of the crown shaped upper portion.

5. The capacitor structure according to claim 1, wherein the contact plugs are arranged in hexagonal, each of the contact plugs has a contact pad exposed on the upper surface of the insulating layer.

\* \* \* \* \*